United States Patent [19]

Watanabe et al.

[11] 3,925,802

[45] Dec. 9, 1975

[54] SEMICONDUCTOR DEVICE

[75] Inventors: Jinzo Watanabe; Noboru Terao; Koichi Kamahara; Kazuhisa Miyashita; Kenji Fujihira, all of Itami, Japan

[73] Assignee: Mitsubishi Denki Kabushiki Kaisha, Japan

[22] Filed: Feb. 21, 1974

[21] Appl. No.: 444,312

[30] Foreign Application Priority Data

Feb. 27, 1973 Japan ............ 48-23497
Feb. 15, 1974 Japan ............ 49-18797

[52] U.S. Cl. ............ 357/20; 357/55; 357/67; 357/68; 357/79; 357/81; 357/82

[51] Int. Cl.² ............ H01L 29/06

[58] Field of Search ............ 357/20, 81, 55, 82, 65, 357/67, 68, 79

[56] References Cited

UNITED STATES PATENTS

| | | | |
|---|---|---|---|
| 2,877,358 | 3/1959 | Ross | 357/55 |
| 2,890,976 | 6/1959 | Leitovec | 357/55 |
| 2,975,344 | 3/1961 | Wegener | 357/55 |
| 3,022,472 | 2/1962 | Tanenbaum et al. | 357/55 |
| 3,122,655 | 2/1964 | Murray | 357/55 |
| 3,173,102 | 3/1965 | Loewenstern | 357/55 |
| 3,304,362 | 2/1967 | August | 357/55 |

*Primary Examiner*—Stanley D. Miller, Jr.
*Assistant Examiner*—Joseph E. Clawson, Jr.
*Attorney, Agent, or Firm*—Robert E. Burns; Emmanuel J. Lobato; Bruce L. Adams

[57] ABSTRACT

A hollow circularly cylindrical N semiconductor substrate includes a P layer disposed on its outer peripheral surface to form a PN junction in the form of a circularly cylindrical surface within the substrate. Two circularly cylindrical electrodes are fitted onto and into the substrate respectively.

6 Claims, 6 Drawing Figures

SEMICONDUCTOR DEVICE

BACKGROUND OF THE INVENTION

This invention relates to improvements in a semiconductor device including at least one PN junction therein.

Conventional semiconductor devices have included at least one PN junction disposed in a flat substrate of semiconductive material as by diffusion from one surface thereof or epitaxial growth thereon. The resulting PN junction is normally in the form of a plane and exposed at the outer periphery to the peripheral surface of the substrate. If a PN junction increases in area in order to increase a current capacity of the associated semi-conductor device then that portion of the PN junction exposed to a peripheral surface of a semiconductor substrate involved has been inevitably increased. As a result, a surface leakage current has been high which has caused a decrease in a voltage withstood by the semi-conductor device.

In the past, it has been usually practiced to use flat semiconductor elements and flat support electrodes therefor to manufacture semiconductor devices. In order to avoid a damage to a semiconductor element caused from the bimetallic action due to a difference in coefficient of thermal expansion between the materials of the element and the adjacent electrode in the thermal cycle, it has been required to use those materials for the element and electrode approximating in coefficient of thermal expansion each other as much as possible. Thus with the semiconductor element formed of silicon, the electrode for supporting the element has been compelled to be formed of molybdenum or tungsten. However, due to their high hardness, such metallic materials have not been easy to be machined and also have not been always ready to be subject to surface treatments, for example, brazing and plating. Therefore the structure of the electrode for semiconductor devices has caused one of limitations as to the design thereof.

SUMMARY OF THE INVENTION

Accordingly it is an object of the present invention to provide a semiconductor device having a new and improved construction.

It is another object of the present invention to provide a new and improved semiconductor device including therein at least one PN junction in the form of a curved surface.

It is still another object of the present invention to provide a new and improved semiconductor device including a substrate of semiconductive material in the form of a hollow cylinder thereby to decrease that portion of a PN junction involved exposed to the surface of the substrate.

It is a further object of the present invention to provide a new and improved semiconductor device suitable for increasing a current capacity thereof.

According to one aspect thereof, the present invention accomplishes these objects by the provision of a semiconductor device comprising a substrate of semiconductive material with one type conductivity in the form of a hollow cylinder having a predetermined cross sectional profile and including an outer peripheral surface and an inner peripheral surface, a semiconductor layer having at least the oppostie type conductivity and disposed on a selected one of outer and inner peripheral surfaces of the substrate to form therebetween a PN junction in the form of a curved surface about the longitudinal axis of the substrate, and a pair of metallic electrodes disposed in ohmic contact with the outer and inner peripheral surfaces of the substrate respectively.

Also an additional object of the present invention is to provide a new combination of electrically conductive materials for the electrodes as described in the preceding paragraph different in coefficient of thermal expansion from the material of the associated semiconductor element while preventing the element from damaging in operation.

According to another aspect thereof, the present invention accomplishes this object by the provision of one electrode composed in the form of a rod complementary in shape to the central opening in the associated semiconductor substrate of an electrically conductive material higher in coefficient of thermal expansion than the material of the substrate and fitted into the opening and the other electrode on the outer peripheral surface of the substrate composed of a metallic material having a coefficient of thermal expansion equal to or less than that of the material of the substrate.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

The fundamental principle of the present invention is to make the PN junction in semiconductor elements into a curved surface. While the PN junction may be in the form of any desired curved surface it is most advantageous to put the PN junction in the form of a circularly cylindrical surface for the following reasons: With the PN junction formed into a circularly cylindrical surface, a uniform electric field is established in the associate semiconductor substrate as well as at that junction. Also the manufacturing and machinering of homogeneous, good quality semiconductor substrates are facilitated and their junctions can be easy to be uniformly formed. Further it is ensured that the electrode is easy to be operatively associated with the semiconductor devices. Therefore the present invention will now be described in conjunction with circularly cylindrical substrates of semiconductive material but it is to be understood that the same is equally applicable to semiconductor substrates having any desired cross sectional profile other than a circular cross sectional profile.

Figure 1:
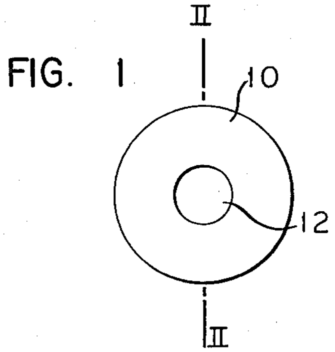
FIG. 1 is a front plan view of a substrate of semiconductive material suitable for use with the present invention.
Figure 2:
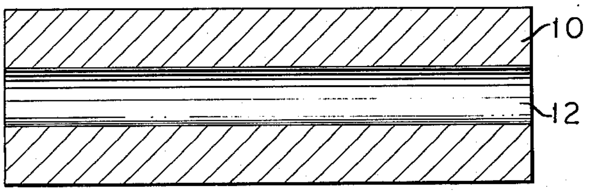
FIG. 2 is a longitudinal sectional view as taken along the line II—II of FIG. 1.

Referring now to the drawings and FIGS. 1 and 2 in particular, it is seen that an arrangement disclosed herein includes a substrate of any suitable semiconductive material such as silicon in the form of a hollow, circular cylinder 10 having a central opening 12 coaxially extending therethrough. Thus the substrate 10 includes an inner and an outer peripheral surface forming two main opposite surface. The substrate 10 in this case is formed of a single crystal of N type silicon. The N type substrate 10 includes an annular P type layer 14 on one of the main surfaces or the inner peripheral surface thereof and an annular $N^+$ type layer 16 on the other main surface or the outer peripheral surface thereof formed as by diffusing impurities imparting the P and N type conductivities respectively into the semiconductive material of the substrate 10 to predetermined depths from the inner and outer peripheral surfaces of the substrate respectively. The annular layers 14 and 16 are coaxial with the longitudinal axis of the substrate 10. The annular P type layer 14 forms a PN junction 18 between the same and the N type substrate 10 while the annular $N^+$ type layer 16 forms an $NN^+$ junction 20 between the same and the $N^+$ type substrate 10 with both junctions coaxial with the longitudinal axis of the substrate 10. In the example illustrated, these junctions 18 and 20 are in the form of circularly cylindrical surfaces also ciaxial with the longitudinal axis of the substrate 10 and therefore with the central opening 12.

Figure 3:
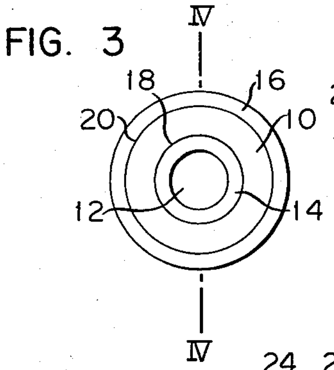
FIG. 3 is a front plan view of a semiconductor element constructed in accordance with the principles of the present invention.
Figure 4:
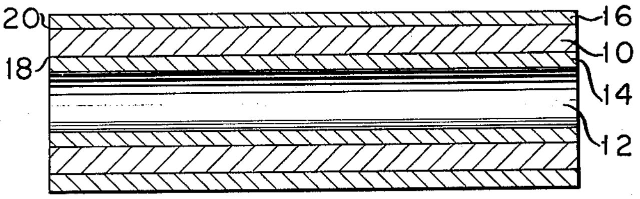
FIG. 4 is a longitudinal sectional view as taken along the line IV—IV of FIG. 3.

The resulting structure is shown in FIGS. 3 and 4 and forms a semiconductor element that is a $PNN^+$ diode in which the innermost layer 14 is of the $N^+$ type and the outermost layer 16 is of the P type with the intermediate layer composed of the original N type semiconductive material.

Figures 5, 6:
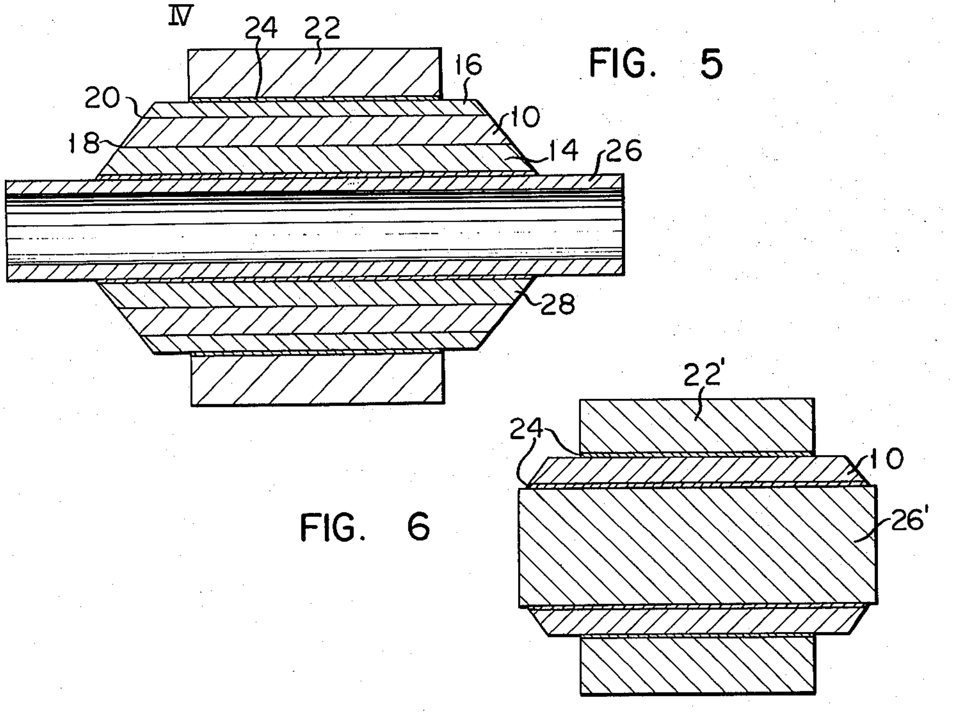
FIG. 5 is a longitudinal sectional view of a semiconductor device constructed in accordance with the principles of the present invention.
FIG. 6 is a view similar to FIG. 5 but illustrating a modification of the present invention.

In FIG. 5 wherein like reference numerals designate the components identical to those shown in FIGS. 3 and 4, there is illustrated a completed semiconductor device comprising the diode as shown in FIGS. 3 and 4 and a pair of metallic electrodes operatively connected thereto.

More specifically, both end faces of the substrate are bevelled to be formed into frusto-conical surfaces. Thus the bevelled outer edges cause the substrate and the layers associated therewith to define two frusto-conical configurations with their bases on opposite sides of the longitudinal axis of the device. Then a hollow cylindrical electrode 22 of any suitable electrically conductive material having an opening complementary in shape to the substrate 10 is fitted onto the latter and mechanically and electrically connected thereto through a layer 24 of any suitable brazing material such as aluminum interposed therebetween. The electrode 22 forms a cathode electrode and terminates short of each end of the outer annular layer 14. Another electrode 26 of similar material complementary in shape to the central opening 12 is fitted into the latter and mechanically and electrically connected thereto through a brazing layer 28 similar to the brazing layer 24 and interposed therebetween. The electrode 26 forms an anode electrode and extends beyond from both ends of the substrate 10. The anode electrode 28 is shown in FIG. 5 as being of a hollow circular cylinder. In this case the interior of the electrode 28 can be utilized as a passageway for a cooling medium whereby the semiconductor device can readily be cooled with a high efficiency.

Metallic materials selected to form the electrode for supporting the associated semiconductor element have been previously forced to approximate in coefficient of thermal expansion the semiconductive material of the element. For example, if the semiconductor element is formed of silicon, then molybdenum or tungsten has been used to form the supporting electrodes. The electrodes 22 and 26 as shown in FIGS. 4 and 5 can be effectively formed of such an electrically conductive material. However, electrically conductive or metallic materials previously used as the electrode have been not easy to be machined due to their high hardness. Also it has not been always facilitated to subject those materials to surface treatments such as brazing and plating. Therefore the selection of an electrode material has been one of the factors of limiting the design of semiconductor devices.

According to another aspect thereof, the present invention contemplates to alleviate the limitation concerning the coefficient of thermal expansion of metallic materials for the supporting electrode and is embodied into a semiconductor device such as shown in FIG. 6. In FIG. 6 like reference numerals designate the components identical to those illustrated in FIGS. 4 and 5. The arrangement illustrated is different from that shown in FIGS. 4 and 5 only in that the inner electrode 26' is in the form of a solid circular cylinder composed of any suitable electrically conductive material greater in coefficient of thermal expansion than the material of the semiconductor substrate 10, while the outer electrode 26' is composed of any suitable electrically conductive material having a coefficient of thermal expansion equal to or smaller than that of the material of the substrate 10. For example, the inner and outer electrodes 22' and 26' can be preferably formed of copper and Invar (Trade Mark) respectively.

The present invention has several advantages: For example, an increase in current capacity can readily be accomplished only by increasing a length of a cylindrical semiconductor substrate involved to broaden an area of a PN junction disposed in the substrate. This increase in the area of the PN junction is not accompanied by an increase in that portion of the PN junction exposed to the surface of the substrate as in the prior art type devices. That is, the PN junction has both edges exposed to the opposite end faces of the substrate and remaining unchanged regardles of the length of the substrate. Therefore even if the current capacity is increased as above described, a corresponding surface leakage current is maintained at a relatively low, fixed magnitude but not increased. Further the semiconduct element of the present invention can decrease in bulk as compared with conventional semiconductor elements similar in current capacity to the same. This is because the present element includes the PN junction in the form of a curved surface.

In addition, the arrangement as shown in FIG. 6 is additionally advantageous in that, upon the inner and outer electrodes and the semiconductor substrate differently expanding during the particular heat treatment or in operation, both electrodes cooperate with each other to apply a compression stress to the substrate thereby to prevent the latter from cracking due to its bending. Also the brazing effect is enhanced resulting in the firm electrical connection of the semiconductor substrate to the electrodes. Further the electrodes are not required to be formed of any of electrically conductive materials approximating in coefficient of thermal expansion a semiconductive material involved and can be formed of any one of the various combinations of electrically conductive materials that may be different in coefficients of thermal expansion than the semiconductive material.

While the present invention has been illustrated and described in conjunction with a few preferred embodiments thereof it is to be understood that numerous changes and modifications may be resorted to without departing from the spirit and scope of the present invention. For example, instead of semiconductor diodes, the present invention is equally applicable to other semiconductor devices such as transistors, thyristors etc. Also with the present invention applied to semiconductor substrates having annular cross section, emitter and collector regions and the like may be disposed on the surfaces of the semiconductor substrate with a great flexibility as compared with flat semiconductor substrates previous employed.

What we claim is:

1. A semiconductor device comprising, a tubular substrate of semiconductor material with one type conductivity, an annular inner layer of semiconductor material of an opposite type conductivity internally of said tubular substrate defining a PN junction therebetween, a tubular conductive anode electrode bonded internally of said annular inner layer of semiconductor material and of greater axial length than said annular layer and said substrate, an $N^+$ type semiconductor annular outer layer circumferentially of said substrate defining an $NN^+$ junction therebetween, a tubular conductive cathode electrode circumferentially of the last-mentioned layer and of lesser axial length, and the substrate and inner and outer layers having bevelled outer edges defining in axial cross-section two frusto-conical configurations each having a base on a side opposite the longitudinal axis of the anode electrode.

2. A semiconductor device according to claim 1, in which each electrode is made of an electrically conductive material having a coefficient of expansion approximating the coefficient of expansion of the semiconductor material of said substrate.

3. A semiconductor device according to claim 1, including a layer brazing material bonding the anode electrode internally of said inner layer of semiconductor material, and a layer of brazing material bonding the cathode electrode to said outer layer of $N^+$ type semiconductor material.

4. A semiconductor device according to claim 1, in which each layer, said substrate and both electrodes are circular in cross section.

5. A semiconductor device according to claim 1, in which each electrode is metallic.

6. A semiconductor device according to claim 1, in which said inner layer is a P-type layer and said substrate is N-type.

* * * * *